United States Patent [19]
Shue et al.

[11] Patent Number: 5,970,378
[45] Date of Patent: Oct. 19, 1999

[54] MULTI-STEP PLASMA TREATMENT PROCESS FOR FORMING LOW RESISTANCE TITANIUM NITRIDE LAYER

[75] Inventors: Shaulin Shue; Chen-Hua Yu, both of Hsin-chu, Taiwan

[73] Assignee: Taiwan Semiconductor Manufacturing Company, Ltd., Hsin-chu, Taiwan

[21] Appl. No.: 08/899,036

[22] Filed: Jul. 23, 1997

Related U.S. Application Data

[63] Continuation of application No. 08/706,875, Sep. 3, 1996, abandoned.

[51] Int. Cl.$^6$ .................................................. H01L 21/44
[52] U.S. Cl. ........................ 438/656; 438/681; 438/685; 438/909
[58] Field of Search ................................. 438/681, 680, 438/685, 656, 909

[56] References Cited

U.S. PATENT DOCUMENTS

| | | | |
|---|---|---|---|
| 5,378,501 | 1/1995 | Foster et al. | 427/255.2 |
| 5,378,660 | 1/1995 | Ngan et al. | 437/247 |
| 5,399,379 | 3/1995 | Sandhu | 427/255.2 |
| 5,504,043 | 4/1996 | Ngan et al. | 437/247 |
| 5,567,483 | 10/1996 | Foster et al. | |
| 5,576,071 | 11/1996 | Sandhu | 427/534 |
| 5,723,382 | 3/1998 | Sandhu et al. | |

*Primary Examiner*—Caridad Everhart
*Attorney, Agent, or Firm*—George O. Saile; Stephen B. Ackerman; Alek P. Szecsy

[57] ABSTRACT

A method for forming a titanium nitride layer within an integrated circuit. There is first provided a substrate. There is then formed over the substrate a virgin titanium nitride layer, where the virgin titanium nitride layer is formed through a chemical vapor deposition (CVD) method employing a tetrakis-diallylamido titanium source material without a halogen activator source material. The virgin titanium nitride layer is then annealed in a first plasma comprising nitrogen and hydrogen to form a refined titanium nitride layer. The refined titanium nitride layer is then annealed in a second plasma comprising nitrogen without hydrogen. Through the method there is formed a titanium nitride layer with superior step coverage, low resistivity and low impurities concentration.

15 Claims, 3 Drawing Sheets

MULTI-STEP PLASMA TREATMENT PROCESS FOR FORMING LOW RESISTANCE TITANIUM NITRIDE LAYER

CROSS-REFERENCE TO RELATED APPLICATION

This application is a file wrapper continuation application of application Ser. No. 08/706,875, filed Sep. 3, 1996, now abandoned.

BACKGROUND OF THE INVENTION

1. Field of the Invention

The present invention relates generally to methods for forming titanium nitride layers within integrated circuits. More particularly, the present invention relates to methods for forming low resistance chemical vapor deposited (CVD) titanium nitride layers within integrated circuits.

2. Description of the Related Art

Generally known in the art of integrated circuit fabrication is the use of titanium nitride layers. Titanium nitride layers within integrated circuit fabrication are most commonly employed as either adhesion promoter layers or barrier layers. When employed as adhesion promoter layers, titanium nitride layers within integrated circuits are typically formed as liner layers beneath blanket tungsten layers from which in turn are formed conductive contact and interconnection studs through patterned dielectric layers within those integrated circuits. Alternatively, when employed as barrier layers, titanium nitride layers are typically formed interposed between an aluminum containing conductor metallization layer and a doped silicon layer or a doped silicon semiconductor substrate. When formed in this location, a titanium nitride layer provides a barrier to inhomogeneous interdiffusion and spiking from the aluminum containing conductor metallization layer into the doped silicon layer or the doped silicon semiconductor substrate. Titanium nitride layers which are employed as barrier layers are particularly well evolved within integrated circuit fabrication. See, for example, Ngan et al., who disclose in U.S. Pat. No. 5,378,660 and U.S. Pat. No. 5,504,043 the use of a sequential annealing method to form a titanium silicide/titanium nitride/titanium oxynitride composite barrier layer for use beneath aluminum layers formed at high temperatures within integrated circuits.

While the barrier layer characteristics of titanium nitride layers and the adhesive layer characteristics of titanium nitride layers have made titanium nitride layers quite common within integrated circuit fabrication, methods through which such titanium nitride layers may be formed within integrated circuits are not entirely without problems. In particular, as integrated circuits device dimensions have decreased, and aspect ratios of apertures within which titanium nitride layers are desired to be formed within those integrated circuits have increased it has become increasingly difficult to form, through conventional physical vapor deposition (PVD) sputtering methods, titanium nitride layers with adequate step coverage. The difficulty derives from the inherent line-of-sight deposition characteristics of conventional physical vapor deposition (PVD) sputtering methods employed in forming integrated circuit layers of titanium nitride, as well as other materials. The line-of-sight deposition characteristics typically provide only limited sidewall and bottom coverage of titanium nitride within a narrow high aspect ratio aperture (ie: an aperture of width less than about 0.5 microns and aspect ratio greater than about 3) within which is desired to form a titanium nitride layer, in comparison with titanium nitride coverage upon the surface of the integrated circuit layer (typically a dielectric layer) within which is formed the aperture.

In response to the step coverage limitations inherent in forming titanium nitride layers through physical vapor deposition (PVD) sputtering methods, there has alternatively been proposed and disclosed the use of chemical vapor deposition (CVD) methods for forming titanium nitride layers within integrated circuits. Titanium nitride layers formed through chemical vapor deposition (CVD) methods have inherently superior step coverage within narrow high aspect ratio apertures within integrated circuits since chemical vapor deposition (CVD) methods, in general, proceed through a surface diffusion deposition phenomenon rather than a line-of-sight deposition phenomenon.

While chemical vapor deposition (CVD) methods may be employed within integrated circuits to provide titanium nitride layers with superior step coverage for narrow high aspect ratio apertures formed within those integrated circuits, chemical vapor deposition (CVD) methods are also not entirely without problems in forming within integrated circuits titanium nitride layers with optimally desirable properties. In that regard, it is known in the art that titanium nitride layers formed through chemical vapor deposition (CVD) methods, while possessing superior step coverage characteristics, are also difficult to form at comparatively low temperatures (ie: less than a temperature of about 550 degrees centigrade at which aluminum containing conductor metallization layers deteriorate) simultaneously with low resistivity and low impurity concentrations. A particularly undesirable impurity formed within titanium nitride layers deposited through such low temperature chemical vapor deposition (CVD) methods is halogen impurities, most typically chlorine impurities. The halogen impurities found within a titanium nitride layer formed through a low temperature chemical vapor deposition (CVD) method may result from halogens intrinsically present within a titanium source material employed in forming the titanium nitride layer (see, for example, Foster et al., in U.S. Pat. No. 5,378,501, who disclose titanium nitride layers formed through a low temperature chemical vapor deposition (CVD) method employing a titanium tetrachloride source material) or halogens employed extrinsically in forming the titanium nitride layer (see, for example, Sandhu, in U.S. Pat. No. 5,399,379, who discloses titanium nitride layers formed through a low temperature chemical vapor deposition (CVD) method employing a tetrakis-dialkylamido titanium (ie: $Ti(NR2)4$) primary source material in conjunction with an extrinsic halogen activator secondary source material). Unfortunately, the presence of halogens within titanium nitride layers formed within integrated circuits through low temperature chemical vapor deposition (CVD) methods is undesirable since the presence of halogens provides titanium nitride layers which are prone to corrosion and electrical leakage. Other undesirable impurities typically found within titanium nitride layers formed through low temperature chemical vapor deposition (CVD) methods employing a tetrakis-dialkylamido titanium primary source material include but are not limited to carbon impurities and oxygen impurities. These impurities typically provide titanium nitride layers of undesirably high sheet resistance.

It is therefore desirable in the art to provide methods and materials through which there may be formed within advanced integrated circuits titanium nitride layers through low temperature chemical vapor deposition (CVD) methods to provide titanium nitride layers which in addition to possessing superior step coverage also simultaneously possess low resistivity and low impurity levels. It is towards those goals that the present invention is specifically directed.

SUMMARY OF THE INVENTION

A first object of the present invention is to provide a low temperature chemical vapor deposition (CVD) method for forming within an integrated circuit a titanium nitride layer with inherently superior step coverage of the titanium nitride layer within narrow high aspect ratio apertures within the integrated circuit.

A second object of the present invention is to provide a method in accord with the first object of the present invention, where the titanium nitride layer so formed simultaneously also possesses a low resistivity and a low impurity concentration.

A third object of the present invention is to provide a method in accord with the first object of the present invention and the second object of the present invention, which method is readily manufacturable.

In accord with the objects of the present invention, there is provided by the present invention a low temperature chemical vapor deposition (CVD) method for forming within an integrated circuit a titanium nitride layer. To practice the method of the present invention, there is first provided a substrate. There is then formed over the substrate a virgin titanium nitride layer through a chemical vapor deposition (CVD) method employing a tetrakis-diallylamido titanium source material without a halogen activator source material. The virgin titanium nitride layer so formed is then annealed in a first plasma comprising nitrogen and hydrogen to form a refined titanium nitride layer. Finally, the refined titanium nitride layer is annealed in a second plasma comprising nitrogen without hydrogen to provide a densified titanium nitride layer exhibiting a low resistivity and a low carbon and oxygen impurity concentration.

The present invention provides a low temperature chemical vapor deposition (CVD) method for forming a titanium nitride layer within an integrated circuit, where the titanium nitride layer so formed has a low resistivity and a low carbon and oxygen impurity concentration. By employing within the method of the present invention a tetrakis-dialkylamido titanium source material absent a halogen activator source material there is formed through the method of the present invention a titanium nitride layer without halogen impurities. The carbon and oxygen impurities which presumably remain within the virgin titanium nitride layer formed through the low temperature chemical vapor deposition (CVD) method employing the tetrakis-dialkylamido titanium source material absent the halogen activator source material are removed through annealing within the first plasma, which comprises nitrogen and hydrogen, to form the refined titanium nitride layer. The refined titanium nitride layer so formed is then densified through annealing within the second plasma comprising nitrogen without hydrogen, thus yielding the low resistivity and low carbon and oxygen impurity concentration titanium nitride layer. Since both low temperature chemical vapor deposition (CVD) methods for forming titanium nitride layers and plasma annealing methods are generally known in the art of integrated circuit fabrication, the novel combination of the low temperature chemical vapor deposition (CVD) method and the two-step plasma annealing method for forming the low resistivity and low carbon and oxygen impurity concentration titanium nitride layer of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a low temperature chemical vapor deposition (CVD) method for forming within an integrated circuit a titanium nitride layer having a low resistivity and a low carbon and oxygen impurity concentration. The present invention achieves this goal by exposing a virgin titanium nitride layer formed through a chemical vapor deposition (CVD) method employing a tetralis-dialkylamido titanium source material absent a halogen activator source material to a two-step plasma annealing method, where the first step within the two-step plasma annealing method employs a first plasma comprising nitrogen and hydrogen and where the second step within the two-step plasma annealing method employs a second plasma comprising nitrogen without hydrogen.

The method of the present invention may be employed in forming low resistivity and low carbon and oxygen impurity concentration titanium nitride layers as layers within integrated circuits including but not limited to adhesion promoter layers and barrier layers. In addition, the method of the present invention may be employed in forming low resistivity and low carbon and oxygen impurity concentration titanium nitride layers within integrated circuits including but not limited to dynamic random access memory (DRAM) integrated circuits, static random access memory (SRAM) integrated circuits, integrated circuits having within their fabrications field effect transistors, integrated circuits having within their fabrications bipolar transistors and integrated circuits having within their fabrications bipolar complementary metal oxide semiconductor (BiCMOS) transistors.

Figure 1:
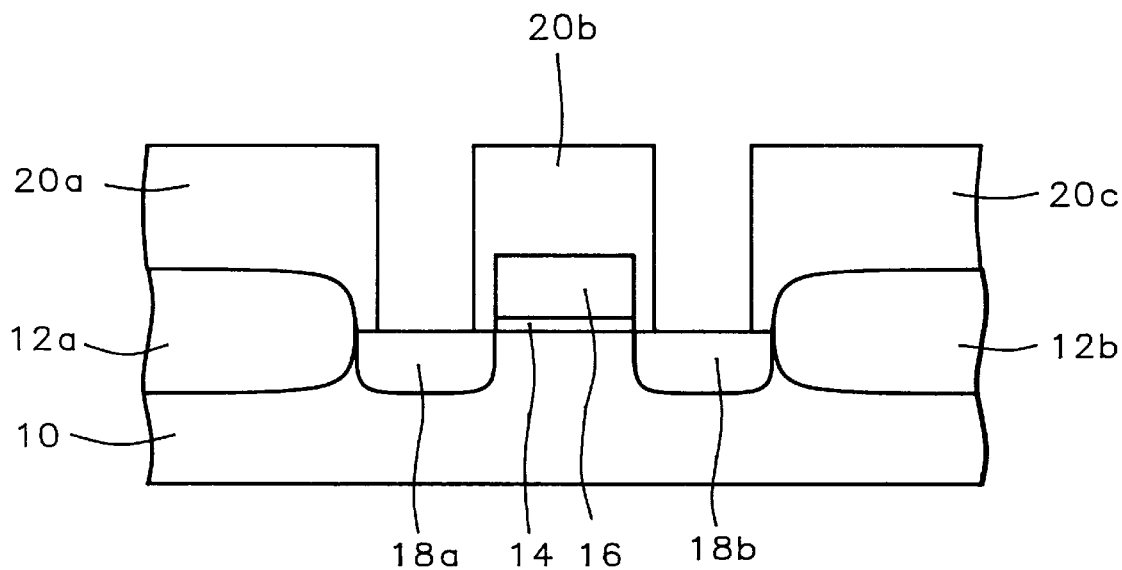
FIG. 1 to FIG. 5 show a series of schematic cross-sectional diagrams illustrating the results of progressive stages in forming within an integrated circuit a low resistivity and low carbon and oxygen impurity titanium nitride layer through the preferred embodiment of the method of the present invention.

Referring now to FIG. 1 to FIG. 5, there is shown a series of schematic cross-sectional diagrams illustrating the results of progressive stages in forming within an integrated circuit a low resistance and low carbon and oxygen impurity concentration titanium nitride layer, in the location of an adhesion promoter layer, in accord with the preferred embodiment of the method of the present invention. Shown in FIG. 1 is a schematic cross-sectional diagram of the integrated circuit at an early stage in its formation.

Shown in FIG. 1 is a semiconductor substrate 10 having formed within and upon its surface a pair of isolation regions which define the active region of the semiconductor substrate 10. Although semiconductor substrates are known in the art with either dopant polarity, several dopant concentrations and various crystallographic orientations, for the preferred embodiment of the method of the present invention, the semiconductor substrate 10 is preferably a (100) silicon semiconductor substrate having a N- or P- doping. Similarly, the isolation regions 12a and 12b may be formed within and upon the semiconductor substrate 10 to define the active region of the semiconductor substrate 10 through conventional methods including but not limited to isolation region growth methods and isolation region deposition/patterning methods.

Also shown in FIG. 1, within the active region of the semiconductor substrate 10, is a series of components which comprise a field effect transistor (FET). The series of components includes a gate dielectric layer 14, a gate electrode 16 and a pair of source/drain regions 18a and 18b. The series of components which comprise the field effect transistor (FET) may be formed though methods and materials as are conventional in the art of forming field effect transistors (FETs) within integrated circuits.

Finally, there is shown in FIG. 1 the presence of a series of patterned planarized pre-metal dielectric (PMD) layers 20a, 20b and 20c formed over the semiconductor substrate 10 including the components which comprise the field effect transistor (FET). The series of patterned planarized pre-metal dielectric (PMD) layers 20a, 20b and 20c may also be formed through methods and materials as are conventional in the art of integrated circuit fabrication. Preferably, the series of patterned planarized pre-metal dielectric (PMD) layers 20a, 20b and 20c is formed of a conformal silicon oxide dielectric material deposited through a plasma enhanced chemical vapor deposition (PECVD) method, planarized through a chemical mechanical polish planarizing method or reactive ion etch (RIE) etchback planarizing method and patterned through a plasma etch patterning method, as is conventional in the art. Other methods and materials may, however, be employed in forming the series of patterned planarized pre-metal dielectric (PMD) layers 20a, 20b and 20c. The method of the present invention provides most value in forming a low resistance and low carbon and oxygen impurity concentration titanium nitride layer when an aperture into which is desired to form the titanium nitride layer, such as the apertures defined by the patterned planarized pre-metal dielectric (PMD) layers 20a, 20b and 20c, has an aperture width of less than about 0.5 microns angstroms and an aperture aspect ratio of greater than about 3.

Figure 2:
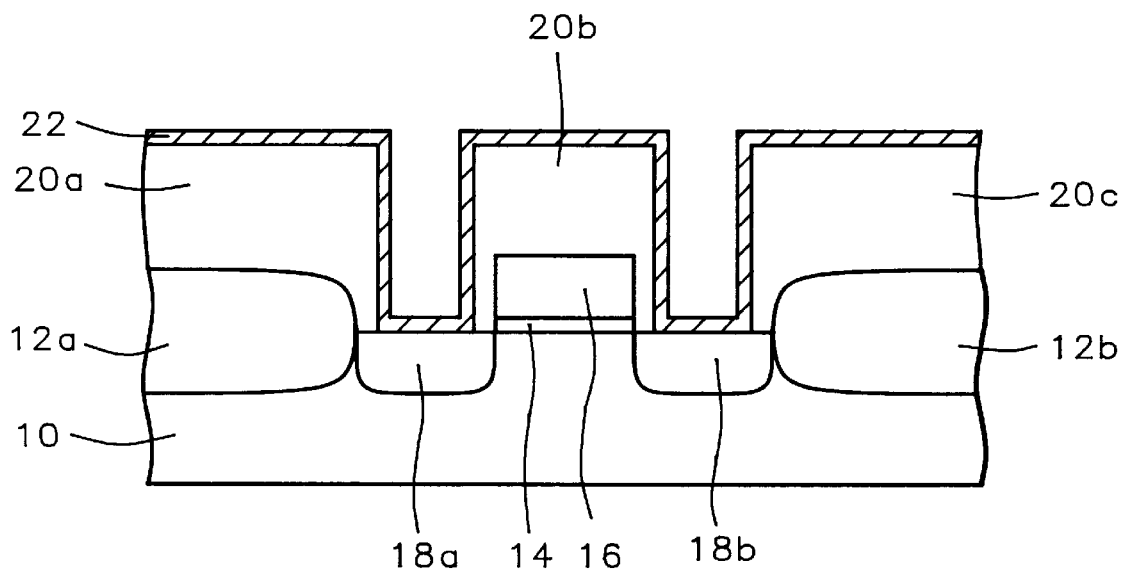

Referring now to FIG. 2, there is shown a schematic cross-sectional diagram illustrating the results of further processing of the integrated circuit whose schematic cross-sectional diagram is illustrated in FIG. 1. Shown in FIG. 2 is the presence of a virgin titanium nitride layer 22 formed upon the integrated circuit whose schematic cross-sectional diagram is illustrated in FIG. 1. In order to simultaneously provide the superior step coverage characteristics and the low halogen impurity concentration characteristics desired within a titanium nitride layer of the present invention, the virgin titanium nitride layer 22 is formed through a chemical vapor deposition (CVD) method employing a tetralds-dialkylamido titanium source material without a halogen activator source material. While tetrakis-dimethylamido titanium (ie: Ti(N(CH3)2)4) is the preferred tetrakis-dialkylamido titanium source material, other alkyl substituents may be employed within the tetrakis-dialkylamido titanium source material while still providing an operative method of the present invention. Tetrakis-dialkylamido titanium source materials with higher allyl substituents may, however, require: (1) revisions to deposition conditions through which are formed virgin titanium nitride layers from those tetrakis-dialkylamido titanium source materials; and (2) revisions to plasma processing conditions through which are further processed those virgin titanium nitride layers.

The preferred chemical vapor deposition (CVD) parameters under which is formed the virgin titanium nitride layer 22 include: (1) a reactor chamber pressure of from about 0.1 to about 10 mtorr; (2) a deposition temperature of from about 300 to about 500 degrees centigrade; (3) a tetrakis-dimethylamido titanium flow rate of from about 100 to about 600 standard cubic centimeters per minute (sccm); (4) a background helium and/or nitrogen gas flow rate of from about 100 to about 600 standard cubic centimeters per minute (sccm); and (5) a spacing between a showerhead deposition nozzle and the semiconductor substrate 10 of from about 350 to about 600 mils. Preferably, the virgin titanium nitride layer 22 is formed to a thickness of from about 100 to about 800 angstroms.

Figure 3:
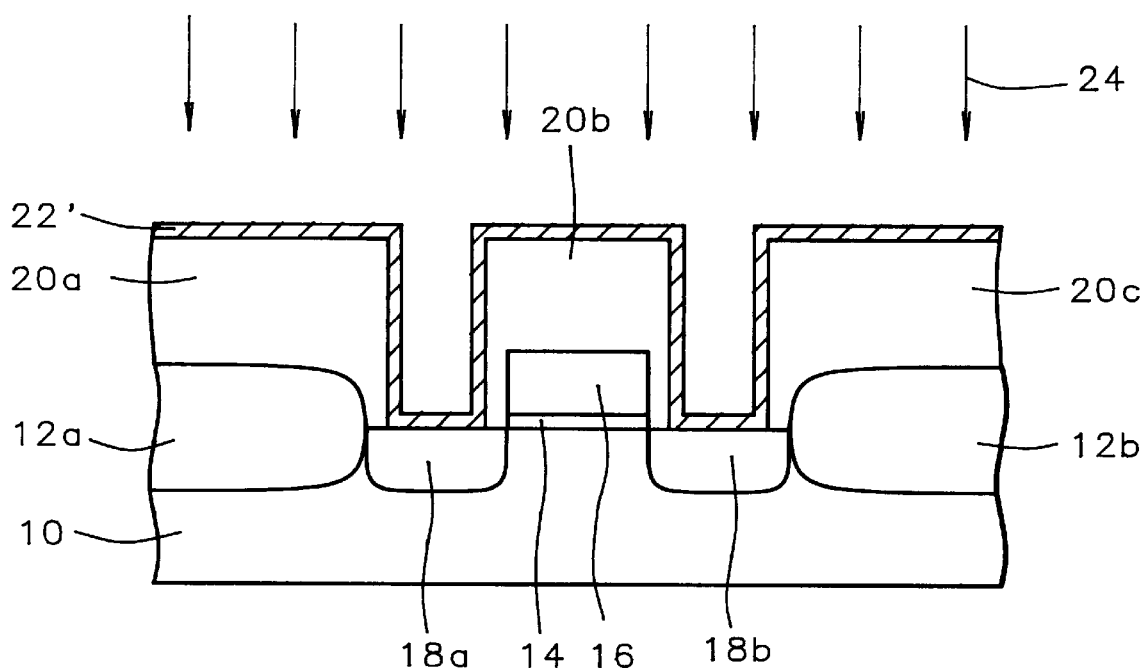

Referring now to FIG. 3, there is shown a schematic cross-sectional diagram illustrating the results of further processing of the integrated circuit whose schematic cross-sectional diagram is illustrated in FIG. 2. Shown in FIG. 3 is the results of refining the virgin titanium nitride layer 22 to form the refined titanium nitride layer 22' through exposure to a first plasma 24. Within the preferred embodiment of the method of the present invention, the first plasma 24 is preferably comprised of nitrogen and hydrogen. Preferably, the first plasma 24 comprised of nitrogen and hydrogen is employed at: (1) a reactor chamber pressure of from about 0.1 to about 10 mtorr; (2) a radio frequency power of from about 300 to about 400 watts at a radio frequency of 13.56 MHZ; (3) a substrate temperature of from about 300 to about 500 degrees centigrade; (4) a total first plasma gas flow rate of from about 800 to about 1600 standard cubic centimeters per minute (sccm) which includes a nitrogen flow rate of from about 400 to about 800 standard cubic centimeters per minute (sccm) and a hydrogen flow rate of from about 400 to about 800 standard cubic centimeters per minute (sccm); (5) a first plasma exposure time of from about 10 to about 60 seconds; and (6) a spacing between a showerhead plasma nozzle and the semiconductor substrate 10 of from about 350 to about 600 mils. More preferably, the first plasma 24 employs a nitrogen flow rate of from about 500 to about 700 standard cubic centimeters per minute (sccm) and a hydrogen flow rate of from about 500 to about 700 standard cubic centimeters per minute (sccm).

Figure 4:
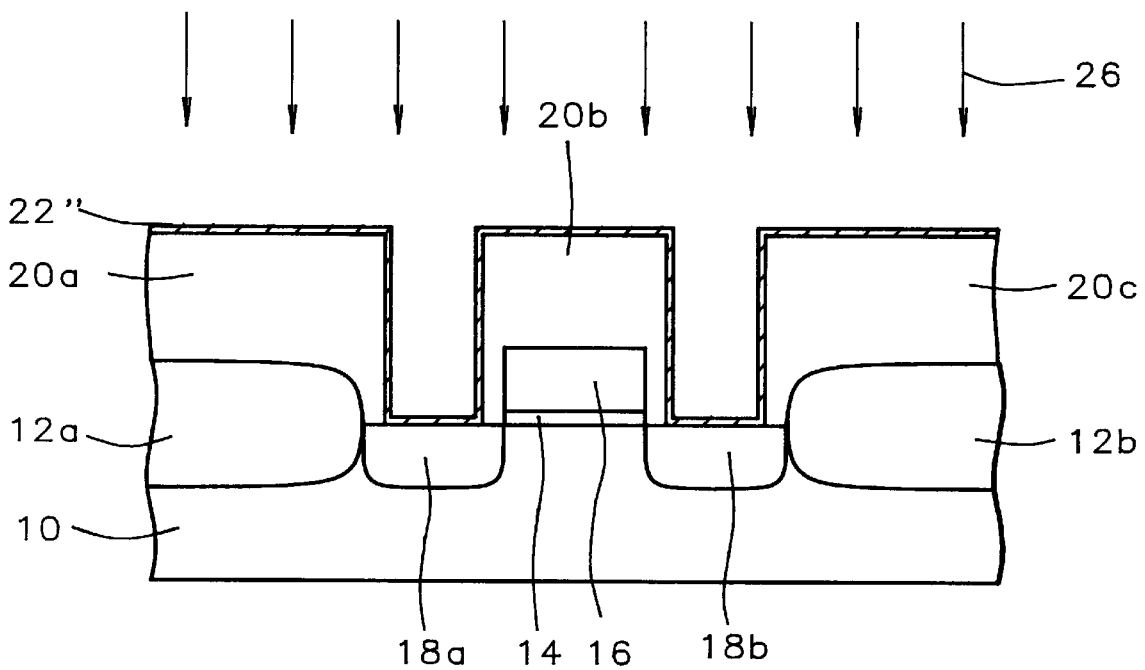

Referring now to FIG. 4, there is shown a schematic cross-sectional diagram illustrating the results of further processing of the integrated circuit whose schematic cross-sectional diagram is illustrated in FIG. 3. Shown in FIG. 4 is the results of densifying through exposure to a second plasma 26 the refined titanium nitride layer 22' to form the densified titanium nitride layer 22" exhibiting a low resistivity. Within the method of the present invention, the second plasma 26 preferably comprises nitrogen without hydrogen. Through treatment of the refined titanium nitride layer 22' with the second plasma 26 to form the densified titanium nitride layer 22" there is formed a densified titanium nitride layer 22" exhibiting a low resistivity as evidenced by a reduced sheet resistance.

For the preferred embodiment of the method of the present invention, the second plasma 26 is preferably employed at: (1) a reactor chamber pressure of from about 0.1 to about 10 mtorr, (2) a radio frequency power of from about 300 to about 400 watts at a radio frequency of 13.56 MHZ; (3) a substrate temperature of from about 300 to about 500 degrees centigrade; (4) a total second plasma gas flow rate of from about 800 to about 1600 standard cubic centimeters per minute (sccm) which includes a nitrogen flow rate of from about 400 to about 1600 standard cubic centimeters per minute (sccm) and a background helium gas flow rate of up to about 800 standard cubic centimeters per minute (sccm); and (5) a spacing between a showerhead plasma nozzle and the semiconductor substrate 10 of from about 350 to about 600 mils. Preferably, the refined titanium nitride layer 22" is exposed to the second plasma 26 for a time period of from about 10 to about 60 seconds. More preferably, the second plasma 26 is employed at a nitrogen flow rate of from about 1000 to about 1200 standard cubic centimeters per minute (sccm) and a helium flow rate of up to about 200 standard cubic centimeters per minute (sccm).

Figure 5:
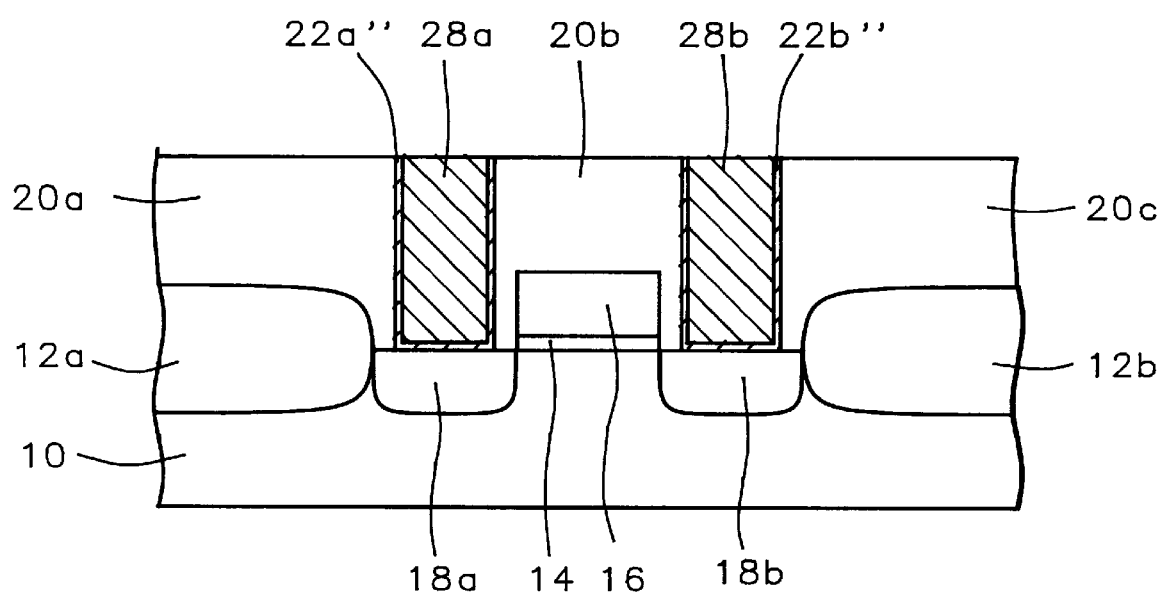

Although not specifically illustrated by the schematic cross-sectional diagrams of FIG. 4 and FIG. 5, it is preferred within the preferred embodiment of the method of the present invention that the virgin titanium nitride layer 22 is exposed to the first plasma 24 and the refined titanium nitride layer 22' is exposed to the second plasma 26 sequentially in-situ without exposure of the semiconductor substrate 10 to air.

Referring now to FIG. 5, there is shown a schematic cross-sectional diagram illustrating the results of further processing of the integrated circuit whose schematic cross-sectional diagram is illustrated in FIG. 4. Shown in FIG. 5 is presence of a pair of conductive contact studs 28a and 28b formed upon a corresponding pair of patterned densified titanium nitride liner layers 22a" and 22b" formed in turn into the apertures between the planarized pre-metal dielectric (PMD) layers 20a, 20b and 20c. As is conventional in the art, the pair of conductive contact studs 28a and 28b is preferably formed of tungsten metal, although other conductive materials, such as metals, metal alloys and doped polysilicon, may also be employed. In the process of forming the conductive contact studs 28a and 28b, the densified titanium nitride layer 22" is patterned to form the patterned densified titanium nitride layers liner layers 22a" and 22b" while employing the patterned planarized pre-metal dielectric (PMD) layers 20a, 20b and 20c as etch stop layers. Within the preferred embodiment of the method of the present invention, the patterned densified titanium nitride liner layers 22a" and 22b" serve as adhesion promoter layers for the pair of conductive contact studs 28a and 28b. Were the conductive contact studs 28a and 28b alternatively formed of an aluminum containing conductor metallization layer, the patterned densified titanium nitride liner layers 22a" and 22b" would also serve as barrier layers to limit interdiffsion and spiking from the conductive contact studs 28a and 28b into the semiconductor substrate 10 at the locations of the source/drain regions 18a and 18b.

EXAMPLES

Upon a series of eight inch semiconductor substrates was formed a series of virgin titanium nitride layers through a low temperature chemical vapor deposition (CVD) method employing tetrakis-dimethylamido titanium (ie: Ti(N(CH3)2)4) as a titanium source material, without a halogen activator source material. The virgin titanium nitride layers were formed at chemical vapor deposition (CVD) method parameters including: (1) a reactor chamber pressure of about 1.5 mtorr, (2) a deposition temperature of about 440 degrees centigrade; (3) a tetrakis-dimethylamido titanium flow rate of about 200 standard cubic centimeters per minute (sccm); (4) a background helium flow rate of about 200 standard cubic centimeters per minute (sccm); and (5) a spacing between a showerhead deposition nozzle and each semiconductor substrate of about 450 mils. Each virgin titanium nitride layer within the series of virgin titanium nitride layers was formed to a thickness of about 300 angstroms through two separate depositions of about 150 angstroms each.

Each of the virgin titanium nitride layers was then exposed to a first plasma comprising nitrogen and hydrogen for a time period of about 20 seconds. The first plasma comprising nitrogen and hydrogen was employed at: (1) a reactor chamber pressure of about 1.5 mtorr; (2) a radio frequency power of about 350 watts at a radio frequency of 13.56 MHZ; (3) a substrate temperature of about 440 degrees centigrade; (4) a nitrogen flow rate of about 600 standard cubic centimeters per minute (sccm); (5) a hydrogen flow rate of about 600 standard cubic centimeters per minute (sccm); and (6) a spacing between a showerhead plasma nozzle and each semiconductor substrate of about 500 mils.

Each of the virgin titanium nitride layers also received a second plasma treatment within a second plasma consisting of either nitrogen or a nitrogen/helium mixture. The second plasmas were provided at: (1) a reactor chamber pressure of about 1.5 mtorr; (2) a radio frequency power of about 350 watts at a radio frequency of 13.56 MHZ; (3) a substrate temperature of about 440 degrees centigrade; and (4) a spacing between a showerhead plasma nozzle and each semiconductor substrate of about 500 mils. The individual concentrations of nitrogen and helium, in addition to the second plasma exposure times for all of the virgin titanium nitride layers, are reported in TABLE I. Also reported in TABLE I is the measured value of sheet resistance determined for each of the titanium nitride layers, along with a titanium nitride layer upon a control semiconductor substrate which received a first plasma treatment but no second plasma treatment, after exposure to its corresponding plasma treatment(s). Finally, there is reported in TABLE I the percentage increase in sheet resistance for each of the titanium nitride layers after 72 hours aging under ambient conditions. All sheet resistance measurements were obtained through methods as are conventional in the art.

TABLE I

| 2nd Plasma Composition (N2/He; sccm/sccm) | Exposure Time (seconds) | Sheet Resistance (ohms/square) | Resistance Increase (72 hours; percent) |
| --- | --- | --- | --- |
| none | none | 321 | 11–13 |
| 1000/200 | 10 | 264 | 7–8 |
| 1000/200 | 15 | 254 | 7–8 |
| 1000/200 | 20 | 216 | 7–8 |
| 800/400 | 10 | 272 | 7–8 |
| 800/400 | 15 | 256 | 7–8 |
| 800/400 | 20 | 248 | 7–8 |
| 600/600 | 10 | 277 | 7–8 |
| 600/600 | 15 | 265 | 7–8 |
| 600/600 | 20 | 274 | 7–8 |
| 1000/0 | 10 | 261 | 7–8 |
| 1000/0 | 15 | 261 | 7–8 |
| 1000/0 | 20 | 247 | 7–8 |

From review of the data in TABLE I, it is seen that by exposure to the second plasmas comprising nitrogen without hydrogen there is provided titanium nitride layers formed through a low temperature chemical vapor deposition (CVD) method having a reduced and more stable sheet resistance in comparison with a titanium nitride layer that has been exposed to only a first plasma comprising nitrogen and hydrogen.

As is understood by a person skilled in the art, the preferred embodiment and examples of the present invention are illustrative of the present invention rather than limiting of the present invention. Revisions may be made to methods, materials, structures and dimensions through which is provided the preferred embodiment and examples of the present invention while still providing embodiments and examples which are within the spirit and scope of the present invention, as defined by the appended claims.

What is claimed is:

1. A method for forming a titanium nitride layer comprising:

providing a substrate;

forming over the substrate a virgin titanium nitride layer, the virgin titanium nitride layer being formed through a chemical vapor deposition (CVD) method employing a tetralds-dialkylamido-titanium source material without a halogen activator source material;

annealing the virgin titanium nitride layer in a first plasma comprising nitrogen and hydrogen to form a refined titanium nitride layer; and annealing then the refined titanium nitride layer in a second plasma comprising nitrogen without hydrogen.

2. The method of claim 1 wherein the virgin titanium nitride layer is from about 100 to about 800 angstroms thick.

3. The method of claim 2 wherein the first plasma employs:

a nitrogen flow rate of about 400 to about 800 standard cubic centimeters per minute (sccm);

a hydrogen flow rate of about 400 to about 800 standard cubic centimeters per minute (sccm);

a radio frequency power of about 300 to about 400 watts; and an exposure time of from about 10 to about 60 seconds.

4. The method of claim 3 wherein the second plasma employs:

a nitrogen flow rate of from about 400 to about 1600 standard cubic centimeters per minute (sccm);

a radio frequency power of from about 300 to about 400 watts; and an exposure time of from about 10 to about 60 seconds.

5. The method of claim 1 wherein the virgin titanium nitride layer is annealed in the first plasma and the refined titanium nitride layer is annealed in the second plasma sequentially in-situ without exposing the substrate to air.

6. A method for forming a titanium nitride barrier layer within an integrated circuit comprising:

providing a semiconductor substrate having semiconductor devices formed thereupon;

forming over the substrate a virgin titanium nitride layer, the virgin titanium nitride layer being formed through a chemical vapor deposition (CVD) method employing a tetrakis-dialkylamido-titanium source material without a halogen activator source material;

annealing the virgin titanium nitride layer in a first plasma comprising nitrogen and hydrogen to form a refined titanium nitride layer;

annealing then the refined titanium nitride layer in a second plasma comprising nitrogen without hydrogen to form a low resistance titanium nitride layer; and forming over the low resistance titanium nitride layer an aluminum containing conductor metallization layer.

7. The method of claim 6 wherein the virgin titanium nitride layer is from about 100 to about 800 angstroms thick.

8. The method of claim 7 wherein the first plasma employs:

a nitrogen flow rate of about 400 to about 800 standard cubic centimeters per minute (sccm);

a hydrogen flow rate of about 400 to about 800 standard cubic centimeters per minute (sccm);

a radio frequency power of about 300 to about 400 watts; and an exposure time of from about 10 to about 60 seconds.

9. The method of claim 8 wherein the second plasma employs:

a nitrogen flow rate of from about 400 to about 1600 standard cubic centimeters per minute (sccm);

a radio frequency power of from about 300 to about 400 watts; and an exposure time of from about 10 to about 60 seconds.

10. The method of claim 6 wherein the virgin titanium nitride layer is annealed in the first plasma and the refined titanium nitride layer is annealed in the second plasma sequentially in-situ without exposing the semiconductor substrate to air.

11. A method for forming a titanium nitride adhesion promoter layer within an integrated circuit:

providing a semiconductor substrate having semiconductor devices formed thereupon;

forming over the semiconductor substrate a virgin titanium nitride layer, the virgin titanium nitride layer being formed through a chemical vapor deposition (CVD) method employing a tetrakis-diallylamido titanium source material without a halogen activator source material;

annealing the virgin titanium nitride layer in a first plasma comprising nitrogen and hydrogen to form a refined titanium nitride layer;

annealing then the refined titanium nitride layer in a second plasma comprising nitrogen without hydrogen to form a low resistance titanium nitride layer; and forming upon the low resistance titanium nitride layer a tungsten layer.

12. The method of claim 11 wherein the virgin titanium nitride layer is from about 100 to about 800 angstroms thick.

13. The method of claim 12 wherein the first plasma employs:

a nitrogen flow rate of about 400 to about 800 standard cubic centimeters per minute (sccm);

a hydrogen flow rate of about 400 to about 800 standard cubic centimeters per minute (sccm);

a radio frequency power of about 300 to about 400 watts; and an exposure time of from about 10 to about 60 seconds.

14. The method of claim 13 wherein the second plasma employs:

a nitrogen flow rate of from about 400 to about 1600 standard cubic centimeters per minute (sccm);

a radio frequency power of from about 300 to about 400 watts; and an exposure time of from about 10 to about 60 seconds.

15. The method of claim 11 wherein the virgin titanium nitride layer is annealed in the first plasma and the refined titanium nitride layer is annealed in the second plasma sequentially in-situ without exposing the semiconductor substrate to air.

* * * * *